United States Patent
Chang et al.

(10) Patent No.: US 12,154,849 B2
(45) Date of Patent: Nov. 26, 2024

(54) CAPACITOR FORMED WITH HIGH RESISTANCE LAYER AND METHOD OF MANUFACTURING SAME

(71) Applicant: Taiwan Semiconductor Manufacturing Company, Ltd., Hsinchu (TW)

(72) Inventors: Mingni Chang, Hsinchu (TW); Hsuan-Ming Huang, Hsinchu (TW); Shiou-Fan Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 355 days.

(21) Appl. No.: 17/667,636

(22) Filed: Feb. 9, 2022

(65) Prior Publication Data
US 2022/0406707 A1 Dec. 22, 2022

Related U.S. Application Data

(60) Provisional application No. 63/212,341, filed on Jun. 18, 2021.

(51) Int. Cl.
| | |
|---|---|
| *H01L 29/00* | (2006.01) |
| *H01L 21/768* | (2006.01) |
| *H01L 23/522* | (2006.01) |
| *H01L 23/532* | (2006.01) |

(52) U.S. Cl.
CPC .... *H01L 23/5223* (2013.01); *H01L 21/76802* (2013.01); *H01L 23/5226* (2013.01); *H01L 23/53266* (2013.01)

(58) Field of Classification Search
CPC .......... H01L 23/5223; H01L 21/76802; H01L 23/5226; H01L 23/53266; H01L 28/40
USPC .......................................... 257/532
See application file for complete search history.

(56) References Cited

U.S. PATENT DOCUMENTS

| | | | |
|---|---|---|---|
| 8,222,513 B2 * | 7/2012 | Luch ............... | H01L 31/0465 136/251 |
| 2015/0348905 A1* | 12/2015 | Tsai ............... | H01L 21/4846 257/774 |

* cited by examiner

*Primary Examiner* — Theresa T Doan
(74) *Attorney, Agent, or Firm* — Lippes Mathias LLP

(57) ABSTRACT

A method is provided for producing a semiconductor structure including at least one capacitor. The method includes: forming a first metal layer; forming a second metal layer; forming a third high resistance (HiR) layer interposed between the first metal layer and the second metal layer, wherein at least one of the first metal layer and the sconed metal layer at least partially overlap with the third HiR layer; and defining at least one of a first capacitor between the first metal layer and the third HiR layer and a second capacitor between the second metal layer and the third HiR layer. Suitably, the method is carried out subsequent to a front-end-of-line (FEOL) portion of a semiconductor fabrication process.

20 Claims, 8 Drawing Sheets

CAPACITOR FORMED WITH HIGH RESISTANCE LAYER AND METHOD OF MANUFACTURING SAME

PRIORITY CLAIM AND CROSS-REFERENCE

This application claims the benefit of U.S. Provisional Application No. 63/212,341 filed Jun. 18, 2021, which is incorporated herein by reference in its entirety.

BACKGROUND

The following relates to the semiconductor arts, and in particular, to a semiconductor device and/or structure having one or more capacitors formed thereon and/or to a method for forming and/or manufacturing the same.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features as shown in the accompany figures may be arbitrarily increased or reduced for clarity of discussion.

DETAILED DESCRIPTION

Figure 1:
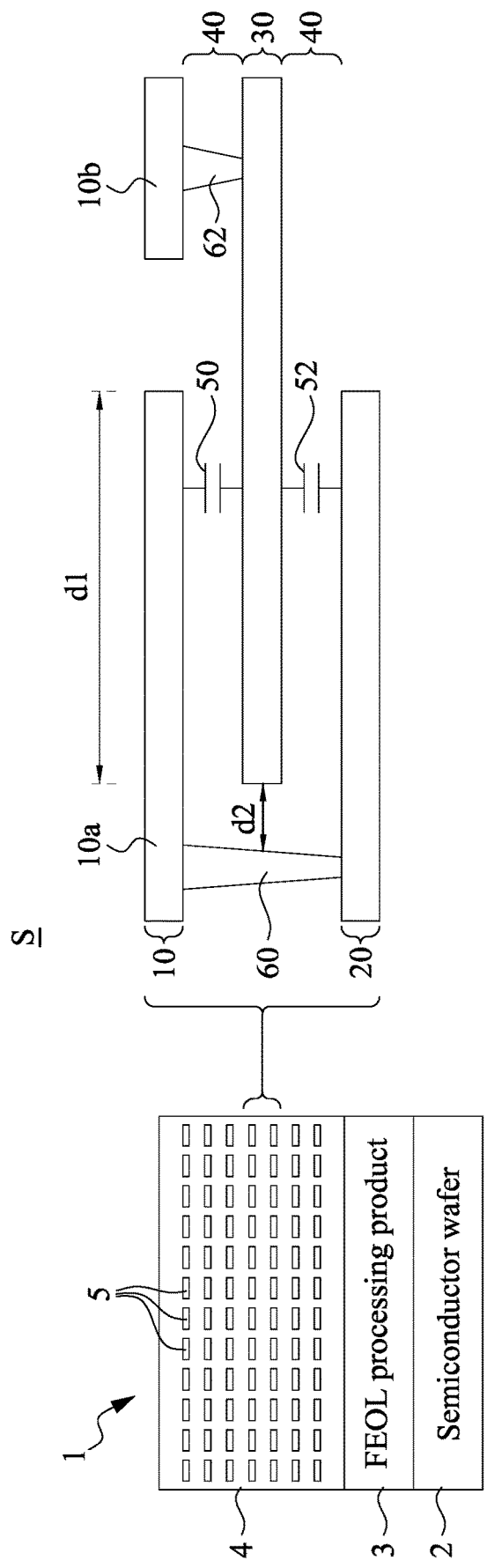
FIG. 1 diagrammatically illustrates a cross-section view of an exemplary semiconductor structure in accordance with some embodiments disclosed herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "left," "right," "side," "back," "rear," "behind," "front," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments described herein, the semiconductor fabrication process is considered to include a front-end-of-line (FEOL) portion, an optional middle-end-of-line (MEOL) portion, and a back-end-of-line (BEOL) portion. The FEOL is the first portion of the semiconductor fabrication process (for example, an integrated circuit (IC) fabrication process), whereby individual active devices are patterned on a semiconductor wafer, for example. In some embodiments, the FEOL processes include, without limitation, selecting the type of semiconductor wafer to be used, chemical-mechanical planarization and cleaning of the wafer, shallow trench isolation (STI), well formation, gate module formation, and source and drain creation, among others. In some embodiments, the FEOL process does not include the deposition of metal interconnect layers. In some embodiments, the optional MEOL processes occur after the FEOL processes and include, for example, without limitation, gate contact formation and under bump metallization (UBM) processes, among others. Suitably, in accordance with some embodiments, the BEOL is the final portion of the semiconductor fabrication process (occurring after the MEOL portion). In some embodiments, the BEOL portion is where, without limitation, individual devices (for example, transistors, capacitors, resistors, etc.) are interconnected with vias and conductive traces, for example.

In accordance with some embodiments described herein, there is disclosed a semiconductor device including more or more capacitors and/or a method of forming the same. In some embodiments, the one or more capacitors are formed during or as part of the BEOL or the MEOL portion of the fabrication process, that is, other than or as opposed to, during or as part of the FEOL portion of the fabrication process. The disclosed capacitors and methods of manufacturing same advantageously repurpose high-resistance (HiR) layers formed the BEOL or MEOL to provide stable resistance elements with weak temperature dependence to additionally or alternatively provide a capacitor or capacitors for the electrical interconnections. Such capacitors can provide a wide range of functionality, such as protection circuitry, RC filtering of radio frequency signals, or so forth. For example, in one non-limiting illustrative application, capacitors formed in the far-BEOL processing product can serve as decoupling capacitors during or after packaging of the IC. While separate decoupling capacitors can be surface mounted onto a packaging substrate, this approach can increase time delay, such as the delay between a spike occurrence and spike suppression. By integrating decoupling capacitors into the BEOL processing product, the internal interconnects can be shorter than external interconnects, thus reducing time delay. Additionally, the BEOL capacitors disclosed herein can have a high capacitance and a wide capacitance range.

In accordance with some embodiments, the BEOL or MEOL portion of the fabrication process includes the deposition and/or other formation of: a first layer of metal or otherwise similarly electrically conductive material; a second layer of metal or otherwise similarly electrically conductive material; and a high resistance (HiR) layer (also referred to herein as a third HiR layer) interposed between the first and second layers. In some suitable embodiments, the aforementioned first, second and third layers are separated from one another by one or more inter-metal dielectric (IMD) layers. In some suitable embodiments, a first capacitor is formed between one of the first and second layers and the third HiR layer. In some suitable embodiments, a second capacitor is formed between the other of the first and second layers and the third HiR layer.

In some suitable embodiments, the first layer may be patterned and may include at least two separate, distinct and/or otherwise disconnected regions. For example, the regions of the first layer may include a first high voltage region and a second low voltage or ground region. In some embodiments, the second layer may also be suitably patterned and may include a high voltage region. The regions nominally termed high voltage regions are arranged to receive or have applied thereto a first voltage which is relatively higher than a second relatively lower voltage or ground. The regions nominally termed low voltage or ground regions are arranged to receive or have applied thereto the second relatively lower voltage and/or are arranged to be interconnected with a suitable ground.

In some suitable embodiments, one or more electrically conductive vias are formed that extend through more or more of the IMD layers. In some suitable, embodiments, one or more such vias interconnect the second low voltage or ground region of the first layer with the third HiR layer. In some suitable embodiments, one or more such vias interconnect the first high voltage region of the first layer with the second layer. In some alternate embodiments, the first and second layers are not interconnected by a via.

FIG. 1 shows a diagrammatical illustration of a cross-section view of a semiconductor-under-fabrication 1. The fabrication process entails front end-of-line (FEOL) processing in which circuit components are formed on a semiconductor wafer 2 (e.g. a silicon wafer, a silicon-on-insulator or SOI wafer, or so forth) such as field effect transistors (FETs, e.g. FinFET, GAAFet, et cetera), diodes, and so forth. The FEOL processing produces a FEOL processing product 3 formed on and/or in a principal surface of the semiconductor wafer 2. Thereafter, back end-of-line (BEOL) processing is performed to electrically interconnect circuit components of the IC under fabrication, thereby forming BEOL processing product 4. Typically, this comprises a stack of patterned metal layers 5 separated by intermetal dielectric (IMD) material, with vias (not shown) forming designed electrical connections between the metal layers 5 and between the metal layers 5 and the FEOL processing product 3. In typical BEOL processing, each metal layer is formed by depositing a layer of IMD material to provide isolation, then depositing a blanket (i.e. continuous) metal layer on the IMD layer and then performing lithographic patterning of the metal layer to define the patterned metal layer 5. Further lithographic processing defines and fills openings in the IMD material separating the various metal layers 5 from the electrical vias. Depending on the IC fabrication process flow, a portion of the electrical interconnects may be formed during middle end-of-line (MEOL) processing. Further shown in FIG. 1 is an exemplary semiconductor structure S in accordance with some embodiments disclosed herein. In some embodiments, the illustrated semiconductor structure S is formed during or as part of the BEOL or MEOL portion 4 of the fabrication process, i.e., not during or as part of the FEOL portion 3 of the fabrication process.

As shown, the semiconductor structure S includes: a first layer 10 of metal or otherwise similarly electrically conductive material, a second layer 20 of metal or otherwise similarly electrically conductive material, and a third HiR layer 30 interposed between the first and second layers 10 and 20. The aforementioned first, second and third layers 10, 20 and 30 are suitably separated from one another by one or more IMD layers 40. As shown in FIG. 1, a first capacitance 50 is formed by the partial overlap between the first layer 10 and the third HiR layer 30 (more specifically, between a high voltage region 10a of the first layer 10 and the third HiR layer 30 ); and a second capacitance 52 is formed by the partial overlap between the second layer 20 and the third HiR layer 30.

In practice, the first layer 10 may be formed of aluminum (Al), copper (Cu), tungsten (W). cobalt (Co) or ruthenium (Ru) or suitable combinations thereof or other like materials. In some embodiments, the second layer 20 may similarly be formed of aluminum (Al), copper (Cu), tungsten (W), cobalt (Co) or ruthenium (Ru) or suitable combinations thereof or other like materials. In some suitable embodiments, the third HiR layer 30 is formed of a high resistance material, for example, without limitation, a metal nitride such as titanium nitride (TiN) or tantalum nitride (TaN) or a tungsten nitride ($W_2N$, WN, $WN_2$, or a mixture thereof), or the like. In some alternative embodiments, the third HiR layer 30 may be formed from cobalt (Co), tungsten (W), or ruthenium (Ru). Advantageously, in some embodiments, the third HiR layer 30 and/or material used therefor has a stable resistance with weak temperature dependence.

In practice, the IMD layers 40 are generally formed from a low dielectric constant (low-k) insulator. Suitable examples include, without limitation, undoped silicate glass (USG), silicon dioxide ($SiO_2$), silicon oxycarbonitride (SiOCN), SiOCH or the like and/or combination thereof.

In some embodiments, the first layer 10 is patterned and/or otherwise formed to include two separate, distinct and/or otherwise disconnected regions. For example, as shown in FIG. 1, such regions of the first layer 10 may include the first high voltage region 10a and a second low voltage or ground region 10b. More particularly, during the BEOL processing a high voltage domain of the IC under fabrication 1 is formed, which is destined in the deployed final IC to be connected with a positive power supply (e.g., the $V_{DD}$ power supply terminal in the case of a FET-family IC). Likewise, a low voltage domain or ground of the IC under fabrication 1 is formed, which is destined in the deployed final IC to be connected with a negative power supply or ground (e.g., the $V_{SS}$ power supply terminal in the case of a FET-family IC). A via 60 connects the first layer 10 and the second layer 20 to form a first plate (in the electrical sense) of a capacitor, and the HiR layer 30 forms the second plate of the capacitor. The capacitance of the thusly formed capacitor is present between the high voltage region 10a and the low voltage or ground region 10b.

In practice, one or more electrically conductive vias are formed that extend through one or more of the IMD layers 40 to selectively interconnect various ones of the first, second and third layers 10, 20 and 30 and/or the respective regions thereof, for example, the regions 10a and 10b of the first layer 10. In some embodiments, the vias are formed, for example, without limitation, from Al, Cu, W, Co or Ru or combinations thereof or other like materials. As shown in FIG. 1, a first such via 60 interconnects the high voltage region 10a of the first layer 10 with the second layer 20; and a second such via 62 interconnects the low voltage or ground region 10b of the first layer 10 with the third HiR layer 30. Advantageously, connecting the third HiR layer 30 to the ground or low voltage domain avoids and/or tends to guard against joule heating and/or IR drop (i.e., the voltage drop resulting as a current passes through a resistance) issues.

In some embodiments, as shown in FIG. 1, the first high voltage region 10a of the first layer 10 and the second layer 20 overlap with the third HiR layer 30 by a length, distance and/or amount d1. In some embodiments, the length, distance or amount d1 is greater than or equal to about 100 micrometers (μm). In some embodiments, as also shown in FIG. 1, the first via 60 interconnecting the first high voltage region 10a of the first layer 10 with the second layer 20 is spaced apart and/or away from an end of the third HiR layer 30 by a length, distance and/or amount d2. In some embodiments, the length, distance or amount d2 is greater than or equal to about 0.15 μm. Advantageously, having the via 60 sufficiently spaced away from the third HiR layer 30 helps avoid the potential introduction of unwanted capacitance therebetween.

Figure 2:
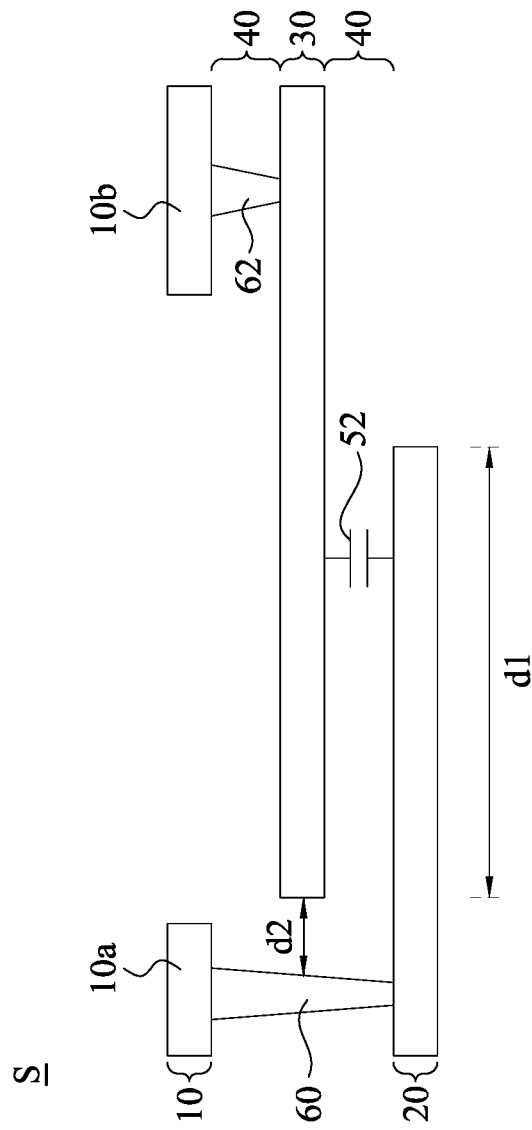
FIG. 2 diagrammatically illustrates a cross-section view of another exemplary embodiment of the semiconductor structure in accordance with some embodiments disclosed herein.

FIG. 2 shows a diagrammatical illustration of a cross-section view of another exemplary embodiment of the semiconductor structure S in accordance with some embodiments disclosed herein. In some embodiments, the illustrated semiconductor structure S (as with the embodiment shown in FIG. 1) is formed during or as part of the BEOL or MEOL portion of the fabrication process, i.e., not during or as part of the FEOL portion of the fabrication process.

As shown in FIG. 2, the semiconductor structure S again includes: a first layer 10 of metal or otherwise similarly electrically conductive material, a second layer 20 of metal or otherwise similarly electrically conductive material, and a third HiR layer 30 interposed between the first and second layers 10 and 20. The aforementioned first, second and third layers 10, 20 and 30 are again suitably separated from one another by one or more IMD layers 40. As shown in FIG. 2, the capacitance 52 is formed by the partial overlap between the second layer 20 and the third HiR layer 30. However, unlike the FIG. 1 embodiment, as shown in FIG. 2, no capacitance is formed between the first layer 10 and the third HiR layer 30. Hence, in this case the first plate of the capacitor is the second layer 20 (and not also the first layer as in the embodiment of FIG. 1), and the second plate of the capacitor is again the HiR layer 30. The via 60 in this case provides for the capacitance of the thusly formed capacitor to be present between the high voltage region 10a and the low voltage or ground region 10b.

As with the FIG. 1 embodiment, similar materials may be employed for the first, second and third layers 10, 20 and/or 30 in the embodiment shown in FIG. 2.

With respect to the embodiment shown in FIG. 2, the IMD layers 40 are again generally formed from a low-k insulator, for example, including, without limitation, USG, $SiO_2$, SiOCN, SiOCH or the like and/or combination thereof.

In some embodiments, the first layer 10 is again patterned and/or otherwise formed to include two separate, distinct and/or otherwise disconnected regions. For example, as shown in FIG. 2, the regions of the first layer 10 may include a first high voltage region 10a and a second low voltage or ground region 10b.

As shown in FIG. 2, one or more electrically conductive vias are formed that extend through one or more of the IMD layers 40 to selectively interconnect various ones of the first, second and third layers 10, 20 and 30 and/or the respective regions thereof, for example, the regions 10a and 10b of the first layer 10. In some embodiments, the vias are formed, for example, without limitation, from Al, Cu, W, Co or Ru or combinations thereof or other like materials. As shown in FIG. 2, a first such via 60 interconnects the high voltage region 10a of the first layer 10 with the second layer 20; and a second such via 62 interconnects the low voltage or ground region 10b of the first layer 10 with the third HiR layer 30. Advantageously, connecting the third HiR layer 30 to the ground or low voltage domain avoids and/or tends to guard against joule heating and/or IR drop (i.e., the voltage drop resulting as a current passes through a resistance) issues.

As shown in FIG. 2, the second layer 20 overlap with the third HiR layer 30 by a length, distance and/or amount d1. In some embodiments, the length, distance or amount d1 is greater than or equal to about 100 micrometers (μm). In some embodiments, as also shown in FIG. 1, the first via 60 interconnecting the first high voltage region 10a of the first layer 10 with the second layer 20 is spaced apart and/or away from an end of the third HiR layer 30 by a length, distance and/or amount d2. In some embodiments, the length, distance or amount d2 is greater than or equal to about 0.15 μm. Unlike the FIG. 1 embodiment, in the embodiment shown in FIG. 2, the high voltage region 10a of the first layer 10 does not overlap with the third HiR layer 30.

Figure 3:
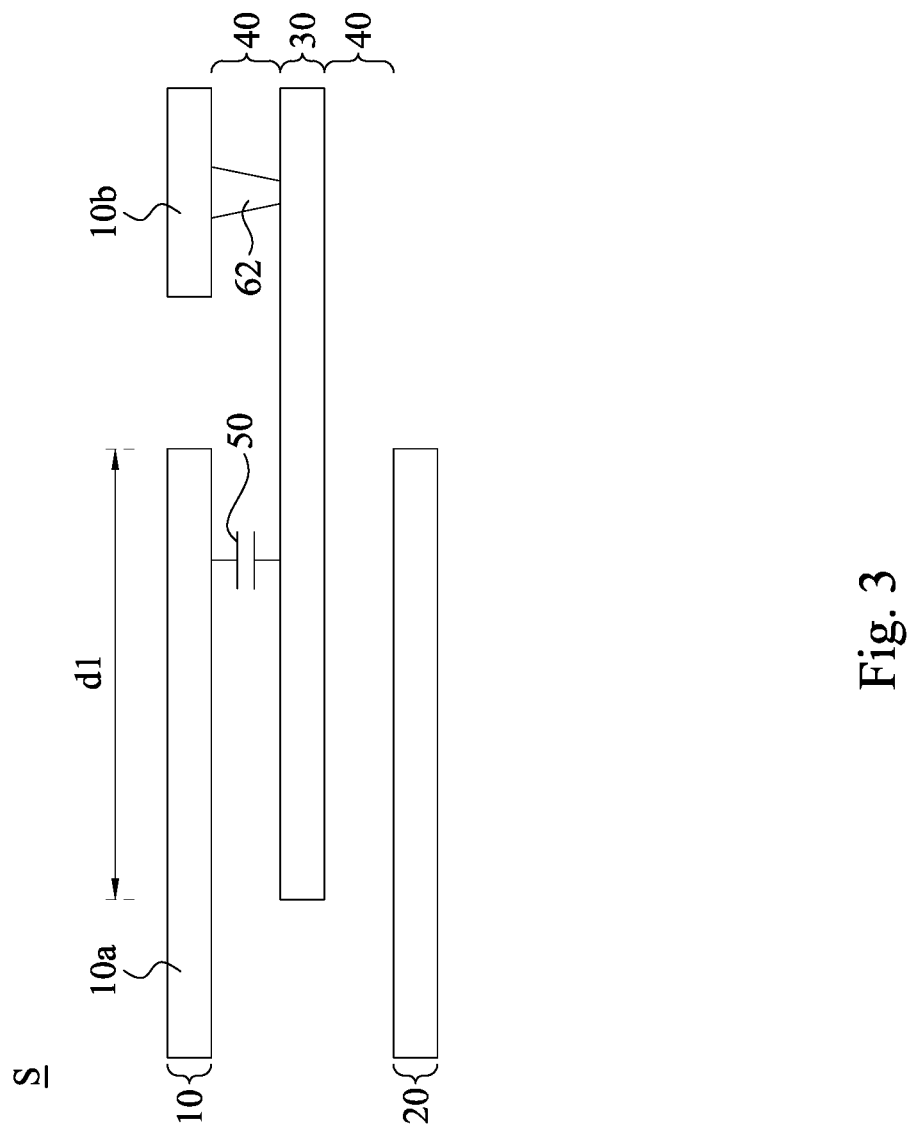
FIG. 3 diagrammatically illustrates a cross-section view of still another exemplary embodiment of the semiconductor structure in accordance with some embodiments disclosed herein.

FIG. 3 shows a diagrammatical illustration of a cross-section view of yet another exemplary embodiment of the semiconductor structure S in accordance with some embodiments disclosed herein. In some embodiments, the illustrated semiconductor structure S (as with the embodiments shown in FIGS. 1 and 2) is formed during or as part of the BEOL or MEOL portion of the fabrication process, i.e., not during or as part of the FEOL portion of the fabrication process.

As shown in FIG. 3, the semiconductor structure S again includes: a first layer 10 of metal or otherwise similarly electrically conductive material, a second layer 20 of metal or otherwise similarly electrically conductive material, and a third HiR layer 30 interposed between the first and second layers 10 and 20. The aforementioned first, second and third layers 10, 20 and 30 are again suitably separated from one another by one or more IMD layers 40. As shown in FIG. 3, a capacitance 50 is formed by the partial overlap between the high voltage region 10a of the first layer 10 and the third HiR layer 30. However, unlike the FIG. 1 embodiment, as shown in FIG. 3, no capacitance is formed between the second layer 20 and the third HiR layer 30.

As with the FIG. 1 and FIG. 2 embodiments, similar materials may be employed for the first, second and third layers 10, 20 and/or 30 in the embodiment shown in FIG. 3.

With respect to the embodiment shown in FIG. 3, the IMD layers 40 are again generally formed from a low-k insulator, for example, including, without limitation, USG, $SiO_2$, SiOCN, SiOCH or the like and/or combination thereof.

In some embodiments, the first layer 10 is again patterned and/or otherwise formed to include two separate, distinct and/or otherwise disconnected regions. For example, as shown in FIG. 3, the regions of the first layer 10 may include a first high voltage region 10a and a second low voltage or ground region 10b.

As shown in FIG. 3, one or more electrically conductive vias are formed that extend through one or more of the IMD layers 40 to selectively interconnect various ones of the first, second and third layers 10, 20 and 30 and/or the respective regions thereof, for example, the regions 10a and 10b of the first layer 10. In some embodiments, the vias are formed, for example, without limitation, from Al, Cu, W, Co or Ru or combinations thereof or other like materials. As shown in FIG. 3, a one such via 62 interconnects the low voltage or ground region 10b of the first layer 10 with the third HiR layer 30. Unlike the FIG. 1 and FIG. 2 embodiments, as shown in FIG. 3, no such via interconnects the high voltage region 10a of the first layer 10 with the second layer 20. However, advantageously again, connecting the third HiR layer 30 to the ground or low voltage domain avoids and/or tends to guard against joule heating and/or IR drop (i.e., the voltage drop resulting as a current passes through a resistance) issues.

Like the FIG. 1 embodiment, as shown in FIG. 3, the high voltage region 10 a of the first layer 10 and the second layer 20 overlap with the third HiR layer 30 by a length, distance and/or amount d1. In some embodiments, the length, distance or amount d1 is again greater than or equal to about 100 μm.

The capacitance of the formed capacitor can be estimated using the equation:

$$C = \frac{\varepsilon A}{d}$$

where ε is the permittivity of the IMD material. In the example of FIG. 2, the capacitance 52 is given by the above equation with the area A being the partial overlap between the second layer 20 and the HiR layer 30, and separation distance d being the separation between the second layer 20 and the HiR layer 30. Similarly, for FIG. 3, the capacitance 50 is given by the above equation with the area A being the partial overlap between the first layer 10 and the HiR layer 30, and separation distance d being the separation between the first layer 10 and the HiR layer 30. For FIG. 1 the total capacitance of the capacitor is the sum of the capacitance 50 and the capacitance 52. Notably, if the HiR layer is inserted centered between two successive metallization layers 5 of the BEOL processing product 4 (see FIG. 1), then the value of the separation d is one-half of the separation of the two successive metallization layers, so that the capacitance C can be twice that achievable for a given area by overlap between the successive metallization layers. Furthermore, the approach of FIG. 1 can achieve a further doubling of the achievable capacitance.

The HiR layer 30 is a patterned layer, and can be patterned to define multiple discontinuous regions. Advantageously, one or more of these discontinuous regions can overlap the upper and/or lower metal layer 10 and/or 20 to form a capacitor, for example as shown in FIGS. 1-3, while one or more other of these discontinuous regions can serve as a BEOL resistor advantageously having stable resistance and weak temperature dependence. Hence, the single patterned HiR layer 30 can provide both capacitor and resistor elements integrated in the BEOL processing product. Using the same patterned HiR layer 30 for forming both capacitors and resistors has a further advantage—a thusly formed capacitor and resistor can be positioned proximately to each other to form a compact RC resonant circuit for various radio frequency signal filtering applications and the like.

Figure 4A:
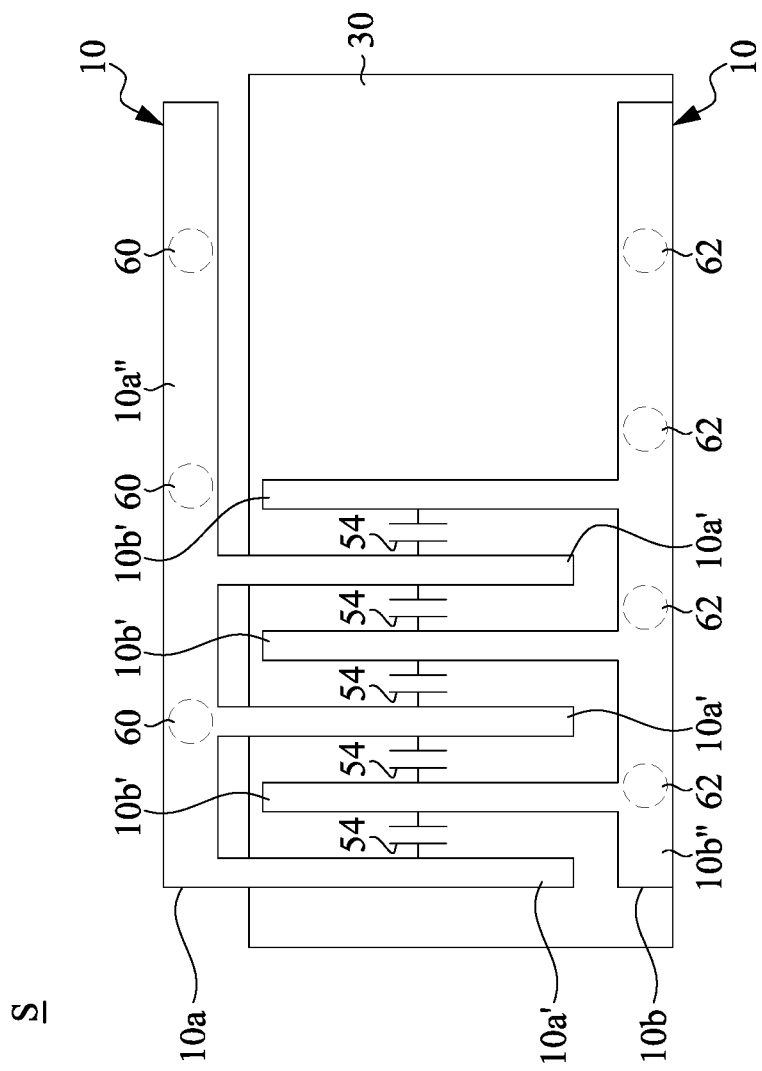
FIGS. 4A and 4B diagrammatically illustrate top or plan views of exemplary embodiments of the semiconductor structure in accordance with some embodiments disclosed herein.
Figure 4B:
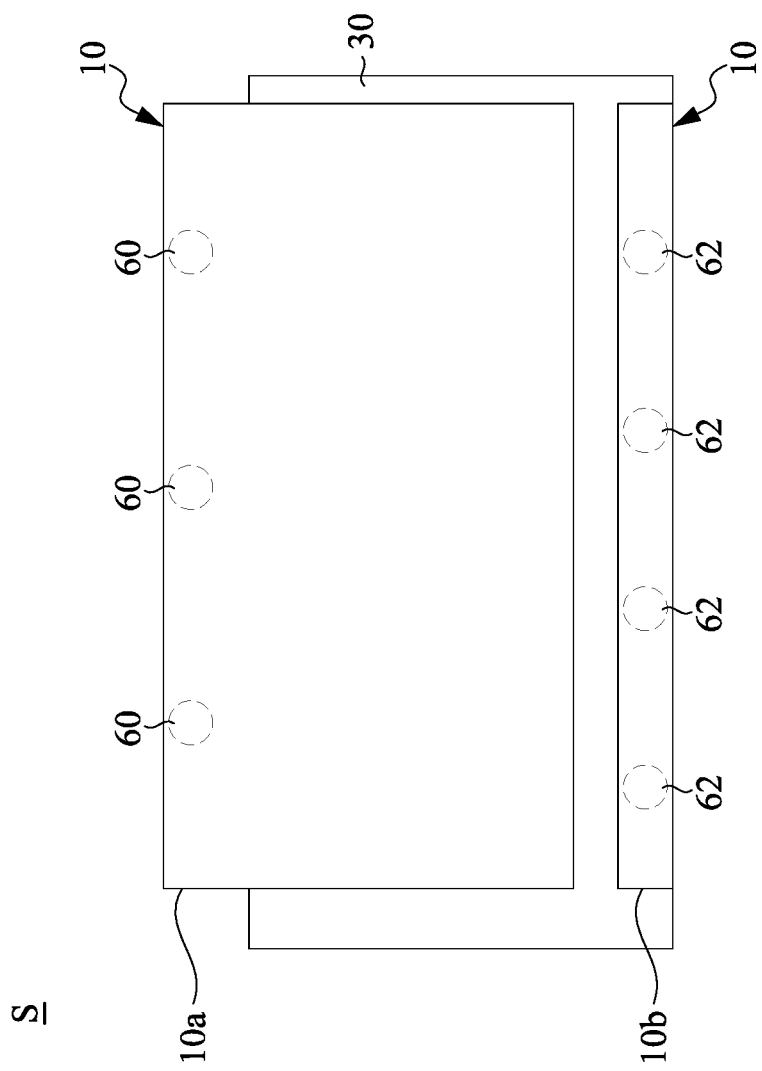

FIGS. 4A and 4B diagrammatically illustrate a top or plan view of exemplary embodiments of the semiconductor structure S. In particular, FIGS. 4A and 4B show exemplary configurations of the first layer 10 and the underlying third HiR layer 30, along with the location of vias 60 and 62 extending from the first layer 10. As the vias 60 and 62 are in fact obscured by the first layer 10 from this perspective, they are shown in phantom and/or by broken or dashed outlines.

As shown in FIG. 4A, the first layer 10 is patterned and/or otherwise formed into a first high voltage region 10a and a second low voltage or ground region 10b. In some embodiments, as shown, the regions 10a and 10b are separate and distinct from one another and/or otherwise do not contact one another.

In some embodiments, the first high voltage region 10a of the first layer 10 is patterned, formed or otherwise shaped as a comb. For example, as shown in FIG. 4A, the comb shape making up the first high voltage region 10a of the first layer 10 suitably includes one or more tines or tine portions 10a' extending from a spine or spine portion 10a". In some embodiments, as shown in FIG. 4A, the spine portion 10a" of the first high voltage region 10a of the first layer 10 does not overlap with the third HiR layer 30; and the tine portions 10a' extend substantially normally from the spine portion 10 a" to sufficiently overlap with the third HiR layer 30, for example, by the length, distance or amount d1. Accordingly, a plurality of capacitors 50 may be formed or otherwise defined between the tine portions 10a' of the high voltage region 10a of the first layer 10 and the third HiR layer 30.

As shown in FIG. 4A, a plurality of first vias 60 extend from the spine portion 10a" of the first high voltage region 10a of the first layer 10 to interconnect the first high voltage region 10a of first layer 10 with the second layer 20, for example, as shown in FIGS. 1 and 2.

In some embodiments, the second low voltage or ground region 10b of the first layer 10 is also patterned, formed or otherwise shaped as a comb. For example, as shown in FIG. 4A, the comb shape making up the second low voltage or ground region 10b of the first layer 10 suitably includes one or more tines or tine portions 10b' extending from a spine or spine portion 10b". In some embodiments, as shown in FIG. 4A, the tine portions 10b' extend substantially normally from the spine portion 10b". As shown in FIG. 4A, at least the spine portion 10b" of the second low voltage or ground region 10b of the first layer 10 substantially overlaps with the third HiR layer 30; and a plurality of second vias 62 extend from the spine portion 10b" to interconnect the second low voltage or ground region 10b of first layer 10 with the third HiR layer 30, for example, as shown in FIGS. 1-3.

As shown in FIG. 4A, in some suitable embodiments, the tine portions 10a' of the first high voltage region 10a of the first layer 10 are interlaced with the tine portions 10b' of the second low voltage or ground region 10b of the first layer 10. That is to say, in general (i.e., for other than the end tines), a particular given tine portion 10a' of the first high voltage region 10a of the first layer 10 is interposed between two consecutive tine portions 10b' of the second low voltage or ground region 10b of the first layer 10, and likewise, a particular given tine portion 10b' of the second low voltage region 10b of the first layer 10 is interposed between two consecutive tine portions 10a' of the first high voltage region 10a of the first layer 10. Accordingly, a plurality of additional capacitors 54 are advantageously formed and/or otherwise defined between pairs of adjacent tine portions 10a' and 10b'.

In some suitable embodiments, as shown in FIG. 4B, the first layer 10 is again patterned and/or otherwise formed into a first high voltage region 10a and a second low voltage or ground region 10b. In some embodiments, as shown, the regions 10a and 10b are again separate and distinct from one another and/or otherwise do not contact one another.

In some suitable embodiments, the first high voltage region 10a of the first layer 10 is patterned and/or formed as a regular shape (i.e., as opposed to the irregular comb shape shown in FIG. 4A). For example, as shown in FIG. 4B, the first high voltage region 10a of the first layer 10 may have a substantially rectangular shape. In some other alternate embodiments, the first high voltage region 10a of the first layer 10 may have another suitable shape, for example, which is substantially regular and/or non-discontinuous.

As shown in FIG. 4B, at least some portion at an end or side of the first high voltage region 10a of the first layer 10 does not overlap with the third HiR layer 30. In some suitable embodiments, it is from this non-overlapping end or side portion of the first high voltage region 10a of the first layer 10 that a plurality of first vias 60 extend to interconnect the first high voltage region 10 a of the first layer 10 with the second layer 20, for example, as shown in FIGS. 1 and 2.

As shown in FIG. 4B, the second low voltage or ground region 10b is patterned and/or formed as a regular shape (i.e., as opposed to the irregular comb shape shown in FIG. 4A). For example, as shown in FIG. 4B, the second low voltage or ground region 10b of the first layer 10 may have a substantially rectangular or bar shape. In some other alternate embodiments, the second low voltage or ground region 10b of the first layer 10 may have another suitable shape, for example, which is substantially regular and/or non-discontinuous. As shown in FIG. 4B, the second low voltage or ground region 10b of the first layer 10 substantially overlaps (for example, in its entirety or near entirety) with the third HiR layer 30; and a plurality of second vias 62 extend therefrom to interconnect the second low voltage or ground region 10b of first layer 10 with the third HiR layer 30, for example, as shown in FIGS. 1-3.

Figure 5A:
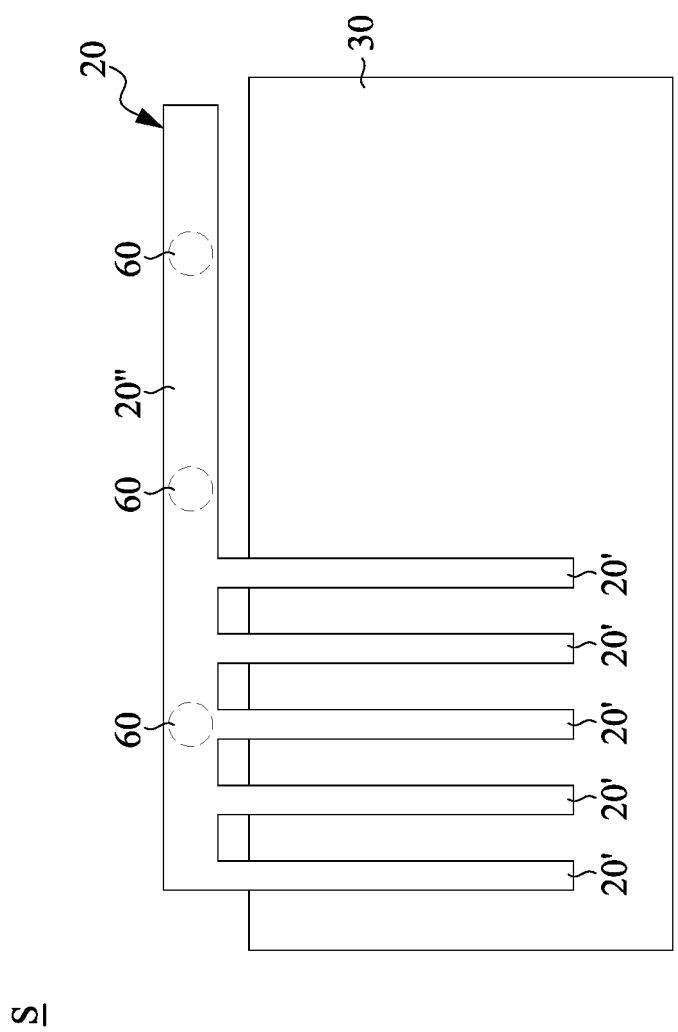
FIGS. 5A and 5B diagrammatically illustrate bottom views of exemplary embodiments of the semiconductor structure in accordance with some embodiments disclosed herein.
Figure 5B:
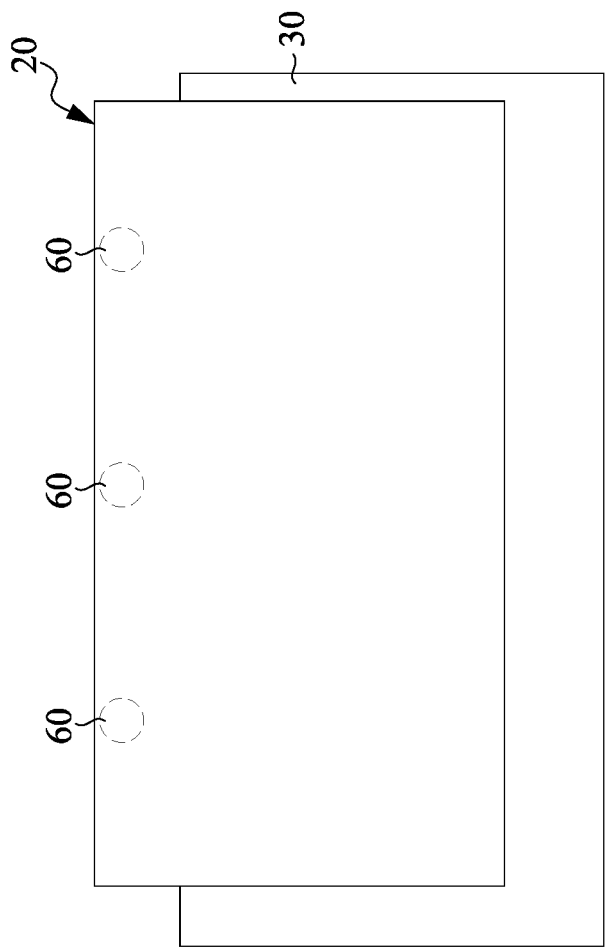

FIGS. 5A and 5B diagrammatically illustrate a bottom view of exemplary embodiments of the semiconductor structure S. In particular, FIGS. 5A and 5B show exemplary configurations of the second layer 20 and the overlying third HiR layer 30, along with the location of vias 60 extending from the second layer 20. As the vias 60 are in fact obscured by the second layer 20 from this perspective, they are shown in phantom and/or by broken or dashed outlines.

As shown in FIG. 5A, the second layer 20 is patterned, formed or otherwise shaped as a comb. For example, as shown in FIG. 5A, the comb shape making up the second layer 20 suitably includes one or more tines or tine portions 20' extending from a spine or spine portion 20". In some embodiments, as shown in FIG. 5A, the spine portion 20" of the second layer 20 does not overlap with the third HiR layer 30; and the tine portions 20' extend substantially normally from the spine portion 20" to sufficiently overlap with the third HiR layer 30, for example, by the length, distance or amount d1. Accordingly, a plurality of capacitors 52 may be formed or otherwise defined between the tine portions 20' of the second layer 20 and the third HiR layer 30.

As shown in FIG. 5A, a plurality of first vias 60 extend from the spine portion 20" of the second layer 20 to interconnect the second layer 20 with the first high voltage region 10a of first layer 10, for example, as shown in FIGS. 1 and 2.

In some suitable embodiments, as shown in FIG. 5B, the second layer 20 is patterned and/or formed as a regular shape (i.e., as opposed to the irregular comb shape shown in FIG. 5A). For example, as shown in FIG. 5B, the second layer 20 may have a substantially rectangular shape. In some other alternate embodiments, the second layer 20 may have another suitable shape, for example, which is substantially regular and/or non-discontinuous.

As shown in FIG. 5B, at least some portion at an end or side of the second layer 20 does not overlap with the third HiR layer 30. In some suitable embodiments, it is from this non-overlapping end or side portion of the second layer 30 that a plurality of first vias 60 extend to interconnect the second layer 20 with the first high voltage region 10a of the first layer 10, for example, as shown in FIGS. 1 and 2.

In some embodiments, for example, as shown in FIG. 4A, the use of a multi-tine comb shape for the high voltage region 10a of the first layer 10 has as one advantage allowing a plurality of capacitors 50 to be defined. In some embodiments, for example, as shown in FIG. 5A, the use of a multi-tine comb shape for the second layer 10 has as one advantage allowing a plurality of capacitors 52 to be defined. In some embodiments, for example, as shown in FIG. 4A, the use of interlaced comb shapes for the high voltage region 10a and the low voltage or ground region 10b of the first layer 10 has as one advantage allowing one or more additional capacitors 54 to be defined. In some alternate embodiments, for example, as shown in FIGS. 4B and 5B, the use of relatively regular and/or simplified shapes (i.e., as opposed to the comb shapes) for the first and second layers 10 and 20 has as one advantage reduced complexity in forming the respective layers (i.e., as compared to forming the comb shapes) and hence reduced complexity in the BEOL or MEOL portions of the semiconductor fabrication process.

Figure 6:
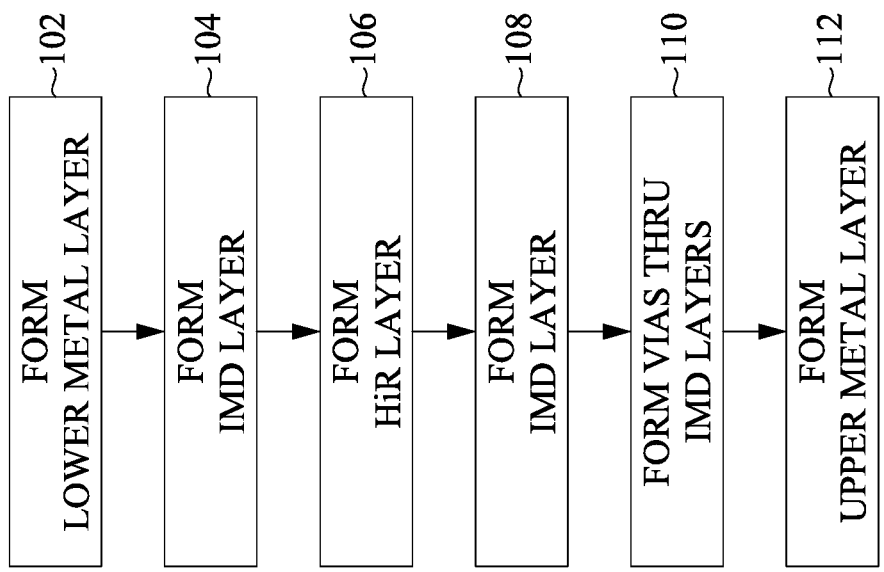
FIG. 6 shows a flow chart diagrammatically illustrating an exemplary method and/or process for forming, creating or otherwise producing the semiconductor structure in accordance with some embodiments disclosed herein.

FIG. 6 shows a flow chart diagrammatically illustrating an exemplary method and/or process 100 for forming, creating or otherwise producing the semiconductor structure S in accordance with some embodiments disclosed herein. Suitably, the method or process is carried out subsequent to the FEOL portion of the semiconductor fabrication process, for example, during the MEOL and/or BEOL portions of the semiconductor fabrication process.

As shown, in step 102, the second layer 20 is patterned, deposited and/or formed over an underlying layer (not shown in FIGS. 1-3). In a typical approach, a blanket layer of metal is deposited on an IMD layer that was previously formed in the BEOL processing sequence, and the blanket metal layer is then lithographically patterned to define electrical traces or other features of the second patterned metal layer 20.

As shown, in step 104, an IMD layer 40 is deposited and/or formed over the second layer 20.

As shown, in step 106, the third HiR layer 30 is patterned, deposited and/or formed over the previously deposited/formed IMD layer 40. In a typical approach, a blanket layer of high resistance metal is deposited on the IMD layer 40 and is then lithographically patterned to define the patterned HiR layer 30.

As shown, in step 108, an IMD layer 40 is deposited and/or formed over the third HiR layer 30.

As shown, in step 110, the vias 60 and 62 are formed. For example, in some embodiments, holes may be etched in and/or through one or more of the IMD layers 40 at appropriate locations and the holes filled with suitable via material such as tungsten or another metal or other electrically conductive material.

As shown, in step 112, the first layer 10 is patterned, deposited and/or formed over the previously deposited/formed IMD layer 40. In a typical approach, a blanket layer of metal is deposited on the IMD layer 40 that was deposited on the HiR layer 30, and the blanket metal layer is then lithographically patterned to define the first patterned metal layer 10.

In the example fabrication process of FIG. 6, the metal layer 20 is formed first in operation 102 and is referred to as the "lower" metal layer, while the metal layer 10 is formed subsequently and is referred to as the "upper" metal layer. However, this order of operations can be reversed, so that the metal layer 10 can in other embodiments be formed before the metal layer 20.

In some suitable embodiments, the patterning and/or forming of the respective layers is achieved by a suitable combination of photolithography, material depositing (for example, using an appropriate material deposition technique) and/or material removal (for example, using an etching or another appropriate material removal technique).

In practice, the various configurations of embodiments illustrated in FIGS. 1-5B may be combined as appropriate. For example, either of the first layer configurations as shown in FIGS. 4A and 4B may be used with either of the second layer configurations as shown in FIGS. 5A and 5B. Likewise, where appropriate, any of the cross-section configurations shown in FIGS. 1-3 may be used with either of the first layer configurations shown in FIGS. 4A and 4B and/or either of the second layer configurations shown in FIGS. 5A and 5B.

In some embodiments, there is realized an advantage of achieving the formation of one or more capacitors during the BEOL and/or MEOL portions of the semiconductor fabrication process, for example, without having to employ an additional photolithography mask, insomuch as newly added layers may not necessarily be introduced in the BEOL and/or MEOL portions of the semiconductor fabrication process. In some embodiments, having a sufficient overlap (for example, greater than or equal to 100 μm) between the third HiR layer and the respective first and/or second layers, advantageously helps to ensure a sufficient capacitance is achieved therebetween. Moreover, in some embodiments, employing the third HiR layer to form the capacitors 50 and/or 52 can advantageously provide a two to three times (or potentially even greater) capacitance gain, for example, compared to a single IMD layer.

In the following, some further illustrative embodiments are described.

In some embodiments, a method is provided for producing a semiconductor structure including at least one capacitor. The method includes: forming a first metal layer; forming a second metal layer; forming a third high resistance (HiR) layer interposed between the first metal layer and the second metal layer, wherein at least one of the first metal layer and the sconed metal layer at least partially overlap with the third HiR layer; and defining at least one of a first capacitor between the first metal layer and the third HiR layer and a second capacitor between the second metal layer and the third HiR layer. Suitably, the method is carried out subsequent to a front-end-of-line (FEOL) portion of a semiconductor fabrication process.

In some further embodiments, the method further includes patterning the first metal layer into at least two distinct disconnected regions including a first region configured to be connected to a high voltage domain and a second region configured to be connected to a low voltage domain or ground.

In still additional embodiments, the method further includes forming a first via interconnecting the second region of the first layer with the third HiR layer.

In some embodiments, the method further includes forming a second via interconnecting the first region of the first layer with the second layer.

In yet further embodiments, the second via is spaced apart from an end of the third HiR layer by an amount greater than or equal to 0.15 μm.

In some further embodiments, the patterning includes: forming the first region into a shape of a comb having a spine portion which does not overlap with the third HiR layer and a plurality of tine portions extending from the spine portion so as to overlap with the third HiR layer; and forming the second region into a shape of a comb having a spine portion and a plurality of tine portions extending from the spine portion. Suitably, the tine portions of the first region are interlaced with the tine portions of the second region to define one or more third capacitors between adjacent pairs of tine portions.

In some embodiments, at least one of the first layer and the second layer overlaps the third HiR layer by an amount greater than or equal to 100 μm.

In yet further embodiments, the method further includes forming one or more inter-metal-dielectric (IMD) layers which space the first layer, the second layer and the third HiR layer apart from one another.

In some embodiments, forming the second layer includes forming the second layer into a shape of a comb having a spine portion which does not overlap with the third HiR layer and a plurality of tine portions extending from the spine portion so as to overlap with the third HiR layer.

In some further embodiments, wherein the method is carried out during one of a middle-end-of-line (MEOL) and a back-end-of-line (BEOL) portion of the semiconductor fabrication process.

In still further embodiments, a method is provided for defining a capacitor in a semiconductor structure formed during at least one of a back-end-of-line (BEOL) and a middle-end-of-line (MEOL) portion of a semiconductor fabrication process. The method includes: providing a first layer of conductive material, the first layer including a first region and a second region disconnected from the first region; providing a second layer of conductive material; providing a third layer of high resistance (HiR) material, wherein the third layer is interposed between the first and second layers such that at least one of the first and second layers at least partially overlaps with the third layer; and providing a first via interconnecting the second region of the first layer with the third layer. Suitably, at least one capacitor is defined between at least one of the first region of the first layer and the third layer and the second layer and the third layer.

In yet additional embodiments, the method further includes providing a second via interconnecting the first region of the first layer with the second layer.

In some further embodiments, the at least one capacitor includes a first capacitor defined between the first region of the first layer and the third layer and a second capacitor defined between the second layer and the third layer.

In some additional embodiments, the method further includes providing one or more inter-metal-dielectric (IMD) layers which space the first layer, the second layer and the third layer apart from one another.

In some embodiments, the HiR material is one of titanium nitride (TiN) and tantalum nitride (TaN).

In some embodiments, the first region is configured to be connected to a first voltage domain and the second region is configured to be connected to a second voltage domain or ground, the first voltage domain being maintained at a first nominal voltage greater than a second nominal voltage at which the second voltage domain is maintained.

In some further embodiments, a semiconductor structure is provided including at least one capacitor therein. The semiconductor structure includes: a first layer of conductive material, the first layer including a first region and a second region not in contact with the first region; a second layer of conductive material; a third layer of high resistance (HiR) material, wherein the third layer is interposed between the first and second layers such that at least one of the first and second layers at least partially overlaps with the third layer; one or more inter-metal-dielectric (IMD) layers which space the first layer, the second layer and the third layer apart from one another; and a first via formed through one or more of the IMD layers and interconnecting the second region of the first layer with the third layer. Suitably, the at least one capacitor is defined between at least one of the first region of the first layer and the third layer and the second layer and the third layer; and the semiconductor structure is formed during at least one of a back-end-of-line (BEOL) and a middle-end-of-line (MEOL) portion of a semiconductor fabrication process.

In still further embodiments, the semiconductor structure further includes a second via formed through one or more of the IMD layers and interconnecting the first region of the first layer with the second layer.

In yet further embodiments, the second via is spaced apart from an end of the third layer by an amount greater than or equal to a distance of 0.15 μm.

In still one more embodiment, at least one of the first layer and the second layer overlaps with the third layer by an amount greater than or equal to a distance of 100 μm.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of defining a capacitor in a semiconductor structure formed during at least one of a back-end-of-line (BEOL) and a middle-end-of-line (MEOL) portion of a semiconductor fabrication process, said method comprising:
    providing a first layer of conductive material, said first layer including a first region and a second region disconnected from the first region;
    providing a second layer of conductive material;
    providing a third layer of high resistance (HiR) material, wherein the third layer is interposed between the first and second layers such that at least one of the first and second layers at least partially overlaps with the third layer; and
    providing a first via interconnecting the second region of the first layer with the third layer;
    wherein at least one capacitor is defined between at least one of the first region of the first layer and the third layer and the second layer and the third layer.

2. The method of claim 1, further comprising:
    providing a second via interconnecting the first region of the first layer with the second layer.

3. The method of claim 2, wherein the at least one capacitor includes a first capacitor defined between the first region of the first layer and the third layer and a second capacitor defined between the second layer and the third layer.

4. The method of claim 1, further comprising:
    providing one or more inter-metal-dielectric (IMD) layers which space the first layer, the second layer and the third layer apart from one another.

5. The method of claim 1, wherein the HiR material is one of a metal nitride, cobalt (Co), tungsten (W), or ruthenium (Ru).

6. The method of claim 1, wherein the first region is configured to be connected to a first voltage domain and the second region is configured to be connected to a second voltage domain or ground, said first voltage domain being maintained at a first nominal voltage greater than a second nominal voltage at which the second voltage domain is maintained.

7. A method of forming a semiconductor structure including at least one capacitor therein, the method comprising:
    forming a first layer of conductive material, said first layer including a first region and a second region not in contact with the first region;
    forming a second layer of conductive material;
    forming a third layer of high resistance (HiR) material, wherein the third layer is interposed between the first and second layers such that at least one of the first and second layers at least partially overlaps with the third layer;
    forming one or more inter-metal-dielectric (IMD) layers which space the first layer, the second layer and the third layer apart from one another; and
    forming a first via formed through one or more of the IMD layers and interconnecting the second region of the first layer with the third layer;
    wherein the at least one capacitor is formed between at least one of: (i) the first region of the first layer and the third layer, and (ii) the second layer and the third layer; and
    wherein the semiconductor structure is formed during at least one of a back-end-of-line (BEOL) and a middle-end-of-line (MEOL) portion of a semiconductor fabrication process.

8. The method of 7, further comprising:
    a second via formed through one or more of the IMD layers and interconnecting the first region of the first layer with the second layer.

9. The method of 8, wherein the second via is spaced apart from an end of the third layer by an amount greater than or equal to a distance of 0.15 um.

10. The method of 7, wherein at least one of the first layer and the second layer overlaps with the third layer by an amount greater than or equal to a distance of 100 μm.

11. The method of 7, wherein the first layer, the second layer and the HiR layers are patterned metal layers.

12. The method of 7, further comprising:
    forming a third via interconnecting the second region of the second layer with the HiR layer.

13. The method of 7, wherein:
    the first region is in a shape of a comb having a spine portion which does not overlap with the HiR layer and a plurality of tine portions extending from the spine portion so as to overlap with the HiR layer;
    the second region is in a shape of a comb having a spine portion and a plurality of tine portions extending from the spine portion; and the tine portions of the first region are interlaced with the tine portions of the second region to define one or more capacitors between adjacent pairs of tine portions.

14. A method for producing a semiconductor structure including at least one capacitor, said method comprising:
  providing a first layer of patterned conductive material, said first layer including a first region and a second region disconnected from the first region;
  providing a second patterned layer of conductive material;
  providing a third layer of patterned high resistance (HiR) material, wherein the third layer is interposed between the first and second layers such that at least one of the first and second layers at least partially overlaps with the third layer; and
  providing a first via interconnecting the second region of the first layer with the third layer;
  wherein at least one capacitor is defined between at least one of the first region of the first layer and the third layer and the second layer and the third layer.

15. The method of 14, further comprising:
  providing a second via interconnecting the first region of the first layer with the second layer.

16. The method of 14, wherein the at least one capacitor includes a first capacitor defined between the first region of the first layer and the third layer and a second capacitor defined between the second layer and the third layer.

17. The method of 14, further comprising:
  providing one or more inter-metal-dielectric (IMD) layers which space the first layer, the second layer and the third layer apart from one another.

18. The method of 14, wherein the HiR material is one of a metal nitride, cobalt (Co), tungsten (W), or ruthenium (Ru).

19. The method of 14, wherein the first region is configured to be connected to a first voltage domain and the second region is configured to be connected to a second voltage domain or ground, said first voltage domain being maintained at a first nominal voltage greater than a second nominal voltage at which the second voltage domain is maintained.

20. The method of 14, wherein:
  the first region is in a shape of a comb having a spine portion which does not overlap with the HiR layer and a plurality of tine portions extending from the spine portion so as to overlap with the HiR layer;
  the second region is in a shape of a comb having a spine portion and a plurality of tine portions extending from the spine portion; and
  the tine portions of the first region are interlaced with the tine portions of the second region to define one or more capacitors between adjacent pairs of tine portions.

* * * * *